(12) United States Patent
Chitragar et al.

(10) Patent No.: US 11,870,370 B2
(45) Date of Patent: Jan. 9, 2024

(54) VARIABLE RESISTANCE BRAKE CASTER ASSEMBLY

(71) Applicant: GOODRICH CORPORATION, Charlotte, NC (US)

(72) Inventors: Venkatesh Chitragar, Bangalore (IN); Vinayak Vijaya Chandran, Bengaluru (IN)

(73) Assignee: GOODRICH CORPORATION, Charlotte, NC (US)

( * ) Notice: Subject to any disclaimer, the term of this patent is extended or adjusted under 35 U.S.C. 154(b) by 832 days.

(21) Appl. No.: 16/945,106

(22) Filed: Jul. 31, 2020

(65) Prior Publication Data

US 2021/0351721 A1 Nov. 11, 2021

(30) Foreign Application Priority Data

May 11, 2020 (IN) .............................. 202041019852

(51) Int. Cl.
| | |
|---|---|
| *H02N 2/04* | (2006.01) |
| *B64D 9/00* | (2006.01) |
| *B65G 13/075* | (2006.01) |
| *B65G 39/02* | (2006.01) |
| *B65G 43/08* | (2006.01) |
| *B65G 39/09* | (2006.01) |

(52) U.S. Cl.
CPC ............... *H02N 2/043* (2013.01); *B64D 9/00* (2013.01); *B65G 13/075* (2013.01); *B65G 39/02* (2013.01); *B65G 39/09* (2013.01); *B65G 43/08* (2013.01); *B64D 2009/006* (2013.01); *B65G 2203/0258* (2013.01); *B65G 2203/042* (2013.01)

(58) Field of Classification Search
CPC ...................................................... H02N 2/043
USPC ..................................................... 310/323.18
See application file for complete search history.

(56) References Cited

U.S. PATENT DOCUMENTS

| | | |
|---|---|---|
| 2009/0152052 A1 | 6/2009 | Schoettke |
| 2015/0223892 A1 | 8/2015 | Miller et al. |
| 2019/0265015 A1 | 8/2019 | Michiwaki |

FOREIGN PATENT DOCUMENTS

CN 106515807 3/2017

*Primary Examiner* — Derek J Rosenau
(74) *Attorney, Agent, or Firm* — SNELL & WILMER L.L.P.

(57) ABSTRACT

A brake mechanism for a brake caster is disclosed. In various embodiments, the brake mechanism includes a roller cylinder having a hollow interior and an inner cylindrical surface; a brake shaft disposed within the hollow interior of the roller cylinder and having an outer cylindrical surface; a piezoelectric disk disposed within the hollow interior of the roller cylinder; and a rotor disk disposed adjacent the piezoelectric disk.

20 Claims, 10 Drawing Sheets

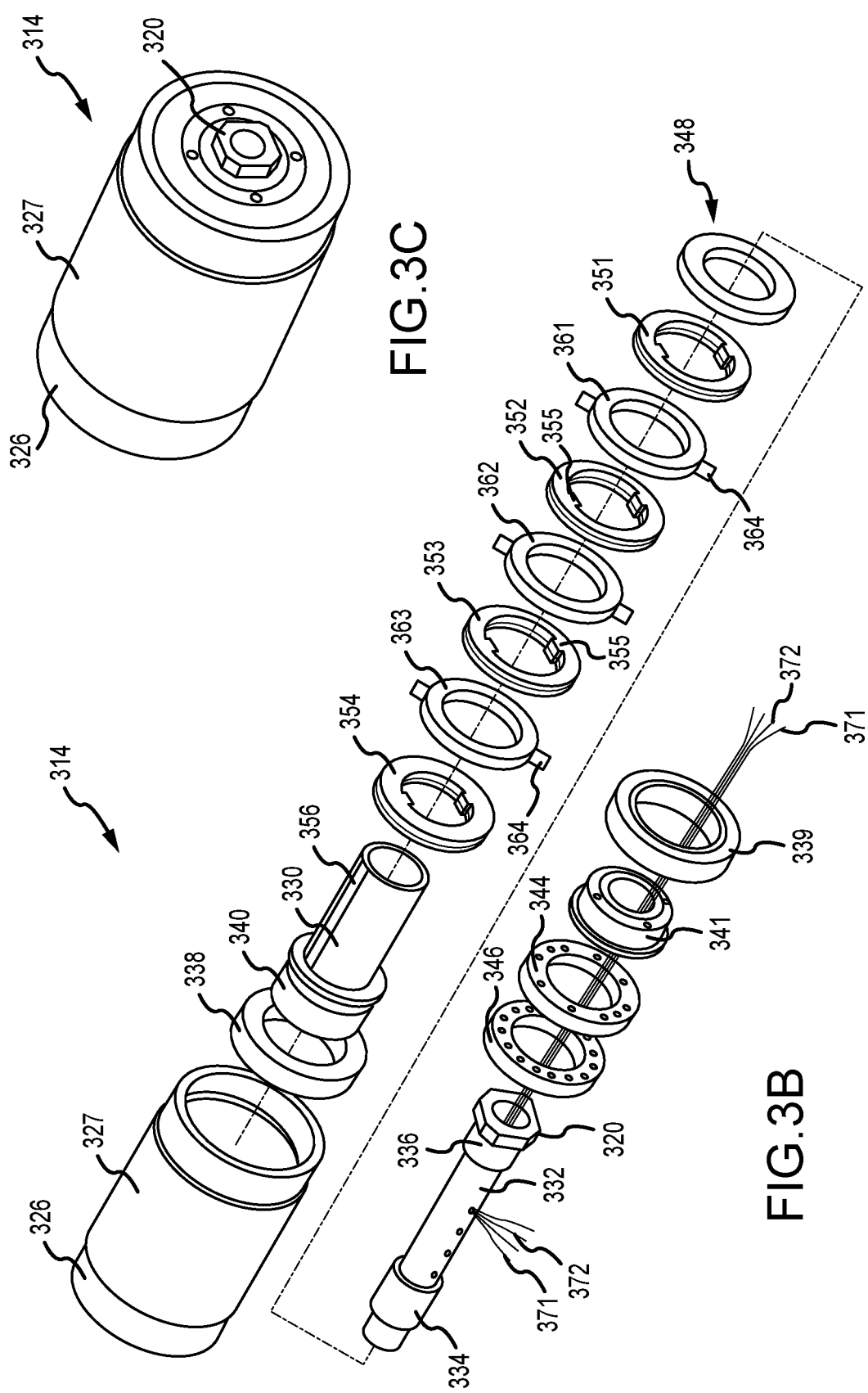

VARIABLE RESISTANCE BRAKE CASTER ASSEMBLY

CROSS REFERENCE TO RELATED APPLICATIONS

This application claims priority to and the benefit of, Indian Patent Application No. 202041019852, filed on May 11, 2020 and entitled "VARIABLE RESISTANCE BRAKE CASTER ASSEMBLY," which is hereby incorporated by reference in its entirety for all purposes.

FIELD

The present disclosure relates generally to cargo handling systems and, more particularly, to subassemblies configured to decelerate or stop the movement of unit load devices on a cargo deck.

BACKGROUND

Cargo handling systems for aircraft typically include various tracks and rollers disposed on a cargo deck that spans the length of a cargo compartment. Cargo may be loaded from an entrance of the aircraft and transported by the cargo system to forward or aft locations, depending upon the configuration of the aircraft. Cargo handling systems, such as, for example, those used on aircraft for transport of heavy containerized cargo or pallets, also referred to herein as unit load devices (ULDs), typically include roller trays containing transport rollers that support and transport the containerized cargo or pallets. Motor driven rollers are typically employed in these systems. In certain aircraft, a plurality of motor driven power drive units (PDUs) is used to propel the containers or pallets within the cargo compartment. This configuration facilitates transportation of the containers or pallets within the cargo compartment by one or more operators or agent-based systems controlling operation of the PDUs.

Unwanted movement of ULDs during loading and unloading may present a safety risk to operators or related loading personnel or result in damage to an aircraft cargo compartment. Braking mechanisms are thus installed within the cargo handling system to help protect loading personnel and the aircraft from possible damage during loading and unloading due to unwanted movement. A typical braking mechanism includes a braking caster, which may have a rotating element that protrudes above a conveyor plane (e.g., the plane upon which the ULDs traverse the cargo deck). The rotating element of the braking caster is configured to decelerate or stop a ULD, but to also allow travel when the ULD is manually or power driven over the cargo deck.

The rotating element typically has a preset braking load selected for a maximum weight of a loaded ULD at a maximum angle of the cargo deck or the conveyor plane. Because of the maximum settings, the braking load may be too powerful to allow the rotating element to roll under light loads. The rotating element often includes a friction material that surrounds the outer surface of a cylindrical roller. In instances where the load applied to the rotating element is not enough to overcome the braking load, the ULD may skid over the roller, wear away the friction material and create a flat spot on the roller.

SUMMARY

A brake mechanism for a brake caster is disclosed. In various embodiments, the brake mechanism includes a roller cylinder having a hollow interior and an inner cylindrical surface; a brake shaft disposed within the hollow interior of the roller cylinder and having an outer cylindrical surface; a piezoelectric disk disposed within the hollow interior of the roller cylinder; and a rotor disk disposed adjacent the piezoelectric disk.

In various embodiments, the rotor disk is configured for rotational engagement with the roller cylinder. In various embodiments, the piezoelectric disk is rotationally stationary with respect to the brake shaft. In various embodiments, the piezoelectric disk includes a radially inwardly extending tab for engagement with an elongate slot disposed within the brake shaft. In various embodiments, the rotor disk includes a radially outwardly extending tab for engagement with the roller cylinder.

In various embodiments, a hollow shaft is disposed within the brake shaft. In various embodiments, a first roller bearing is disposed between the brake shaft and the hollow shaft and configured to enable the brake shaft to rotate with respect to the hollow shaft. In various embodiments, the first roller bearing is a unidirectional roller bearing. In various embodiments, a second roller bearing is disposed between the roller cylinder and the brake shaft and configured to enable the roller cylinder to rotate with respect to the brake shaft. In various embodiments, the hollow shaft includes a locking feature configured to prevent the hollow shaft from rotating with respect to a tray.

In various embodiments, the piezoelectric disk is configured to expand an axial distance with respect to the brake shaft upon a voltage difference being applied across a first conductor and a second conductor, the first conductor and the second conductor being electrically coupled to the piezoelectric disk. In various embodiments, the axial distance is proportional to the voltage difference applied across the first conductor and the second conductor.

In various embodiments, the piezoelectric disk is configured to provide a rotational resistance to the roller cylinder with respect to the brake shaft upon the voltage difference being applied across the first conductor and the second conductor. In various embodiments, the rotational resistance is proportional to the voltage difference applied across the first conductor and the second conductor.

A method for adjusting a braking force of a brake caster configured for operation within a cargo handling system is disclosed. In various embodiments, the method includes the steps of determining a weight of a load being conveyed over the brake caster via a load sensor; providing a signal to a processor, the signal being representative of the weight of the load being conveyed over the brake caster; determining a voltage to be applied to a piezoelectric material disposed within the brake caster and configured to provide a rotational resistance to the brake caster; and applying the voltage to the piezoelectric material to adjust the braking force of the brake caster. In various embodiments, the brake caster includes a roller cylinder having a hollow interior and a brake shaft disposed within the hollow interior, and wherein the piezoelectric material is a piezoelectric disk disposed between the roller cylinder and the brake shaft.

In various embodiments, the piezoelectric disk is configured to expand an axial distance with respect to the brake shaft upon a voltage difference being applied across a first conductor and a second conductor, the first conductor and the second conductor being electrically coupled to the piezoelectric disk, and wherein the axial distance is proportional to the voltage difference applied across the first conductor and the second conductor.

In various embodiments, the piezoelectric disk is configured to provide the rotational resistance to the roller cylinder with respect to the brake shaft upon the voltage difference being applied across the first conductor and the second conductor, and wherein the rotational resistance is proportional to the voltage difference applied across the first conductor and the second conductor.

A brake subassembly for a brake mechanism is disclosed. In various embodiments, the brake subassembly includes a piezoelectric disk configured for engagement with a roller cylinder or a brake shaft; and a rotor disk configured for engagement with the roller cylinder or the brake shaft, and wherein the piezoelectric disk is configured to expand an axial distance with respect to the brake shaft upon a voltage difference being applied across a first conductor and a second conductor, the first conductor and the second conductor being electrically coupled to the piezoelectric disk, and wherein the axial distance is proportional to the voltage difference applied across the first conductor and the second conductor. In various embodiments, the piezoelectric disk is configured to provide a rotational resistance to the roller cylinder with respect to the brake shaft upon the voltage difference being applied across the first conductor and the second conductor, and wherein the rotational resistance is proportional to the voltage difference applied across the first conductor and the second conductor.

The foregoing features and elements may be combined in various combinations and without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

FIG. 3B illustrates an exploded view of a brake mechanism, in accordance with various embodiments;

FIG. 3C illustrates a perspective view of an assembled brake mechanism, in accordance with various embodiments;

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an" or "the" may include one or more than one and that reference to an item in the singular may also include the item in the plural. Further, all ranges may include upper and lower values and all ranges and ratio limits disclosed herein may be combined.

Figure 1A:
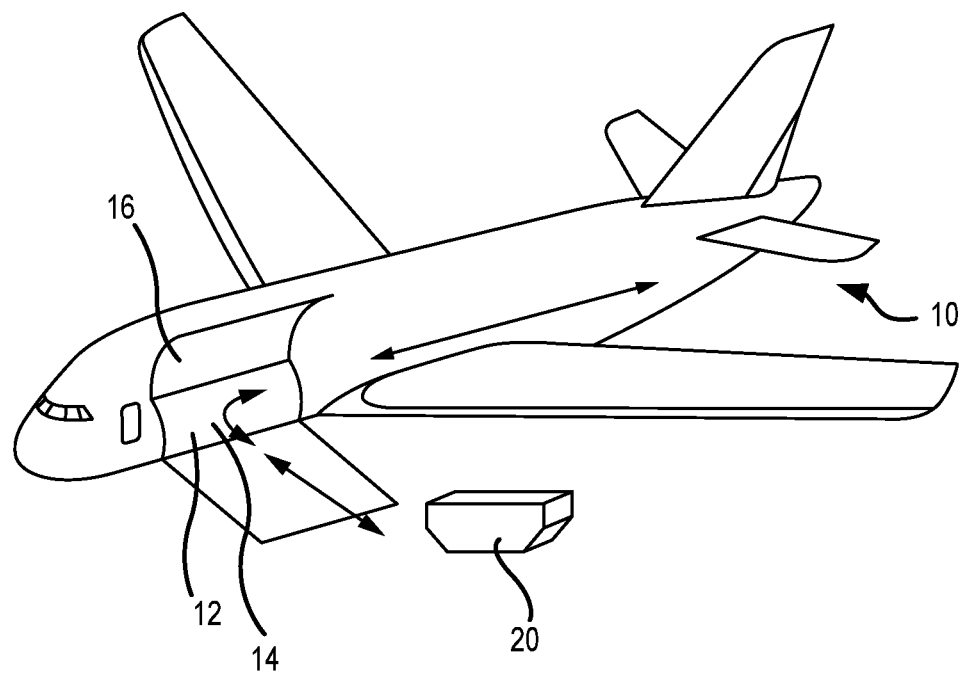
FIG. 1A illustrates a schematic view of an aircraft being loaded with cargo, in accordance with various embodiments.

With reference to FIG. 1A, a schematic view of an aircraft 10 having a cargo deck 12 located within a cargo compartment 14 is illustrated, in accordance with various embodiments. The aircraft 10 may comprise a cargo load door 16 located, for example, at one side of a fuselage structure of the aircraft 10. A unit load device (ULD) 20, in the form of a container or pallet, for example, may be loaded through the cargo load door 16 and onto the cargo deck 12 of the aircraft 10 or, conversely, unloaded from the cargo deck 12 of the aircraft 10. In general, ULDs are available in various sizes and capacities, and are typically standardized in dimension and shape. Once loaded with items destined for shipment, the ULD 20 is transferred to the aircraft 10 and then loaded onto the aircraft 10 through the cargo load door 16 using a conveyor ramp, scissor lift or the like. Once inside the aircraft 10, the ULD 20 is moved within the cargo compartment 14 to a final stowed position. Multiple ULDs may be brought on-board the aircraft 10, with each ULD 20 being placed in a respective stowed position on the cargo deck 12. After the aircraft 10 has reached its destination, each ULD 20 is unloaded from the aircraft 10 in similar fashion, generally in reverse sequence to the loading procedure. To facilitate movement of the ULD 20 along the cargo deck 12, the aircraft 10 may include a cargo handling system as described herein in accordance with various embodiments.

Figure 1B:
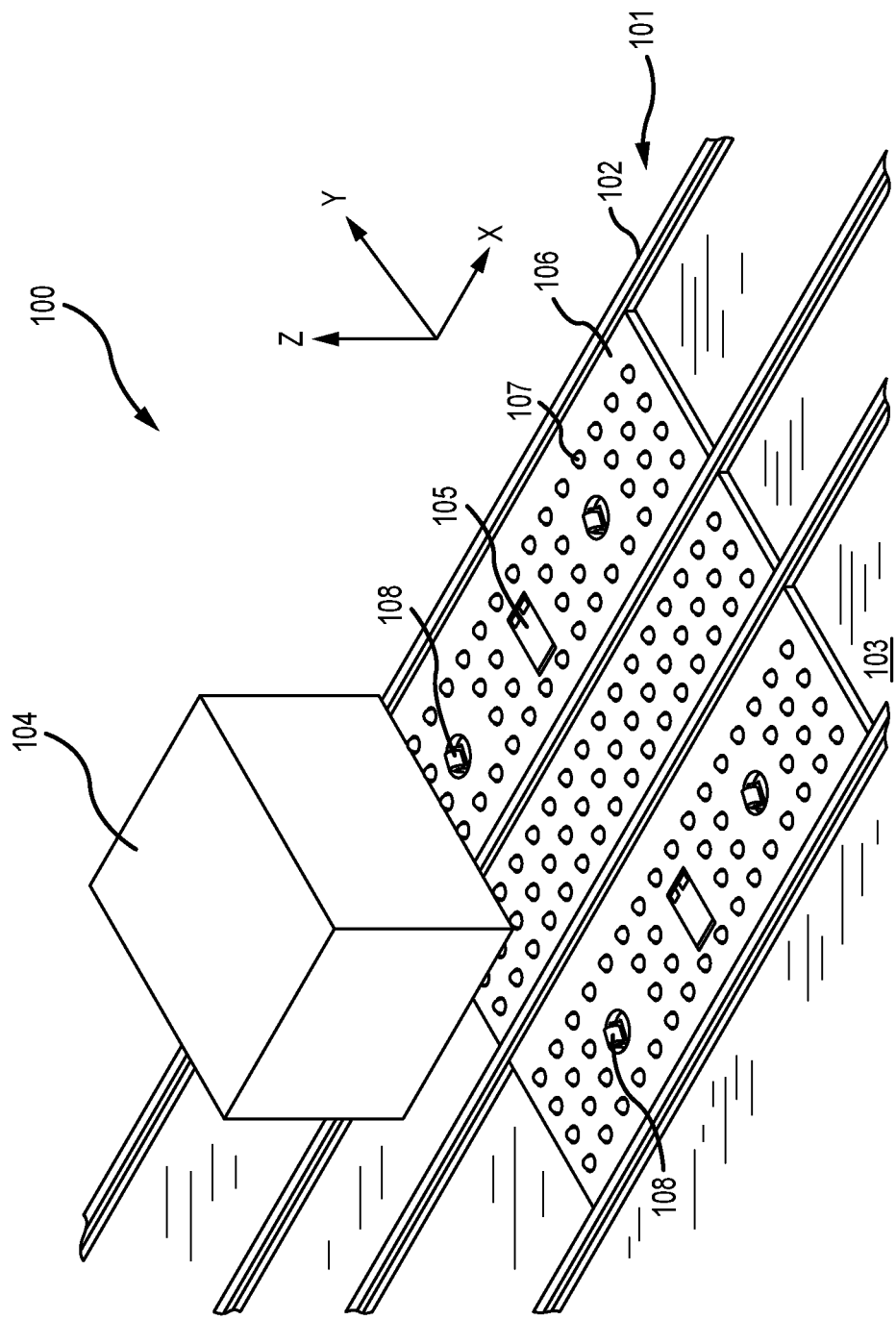
FIG. 1B illustrates a portion of a cargo handling system, in accordance with various embodiments.

Referring now to FIG. 1B, a portion of a cargo handling system 100 is illustrated, in accordance with various embodiments. The cargo handling system 100 is illustrated with reference to an XYZ coordinate system, with the X-direction extending longitudinally and the Z-direction extending vertically with respect to an aircraft in which the cargo handling system 100 is positioned, such as, for example, the aircraft 10 described above with reference to FIG. 1A. In various embodiments, the cargo handling system 100 may define a conveyance surface 101 having a plurality of trays 102 supported by a cargo deck 103, such as, for example, the cargo deck 12 described above with reference to FIG. 1A. The plurality of trays 102 may be configured to support a unit load device (ULD) 104 (or a plurality of ULDs), such as, for example, the unit load device (ULD) 20 described above with reference to FIG. 1A. In various embodiments, the ULD 104 may comprise a container or a pallet configured to hold cargo as described above. In various embodiments, the plurality of trays 102 is disposed throughout the cargo deck 103 and may support a plurality of power drive units 105, a plurality of ball panels 106, each having a plurality of ball transfer units 107, and a plurality of brake caster assemblies 108, together with other components configured to convey cargo over the cargo deck 103. In various embodiments, the plurality of brake caster assemblies 108 is located proximate a cargo load door, such as, for example, the cargo load door 16 described above with reference to FIG. 1A, but may also be located throughout the cargo handling system 100 or the cargo deck.

Figure 2A:
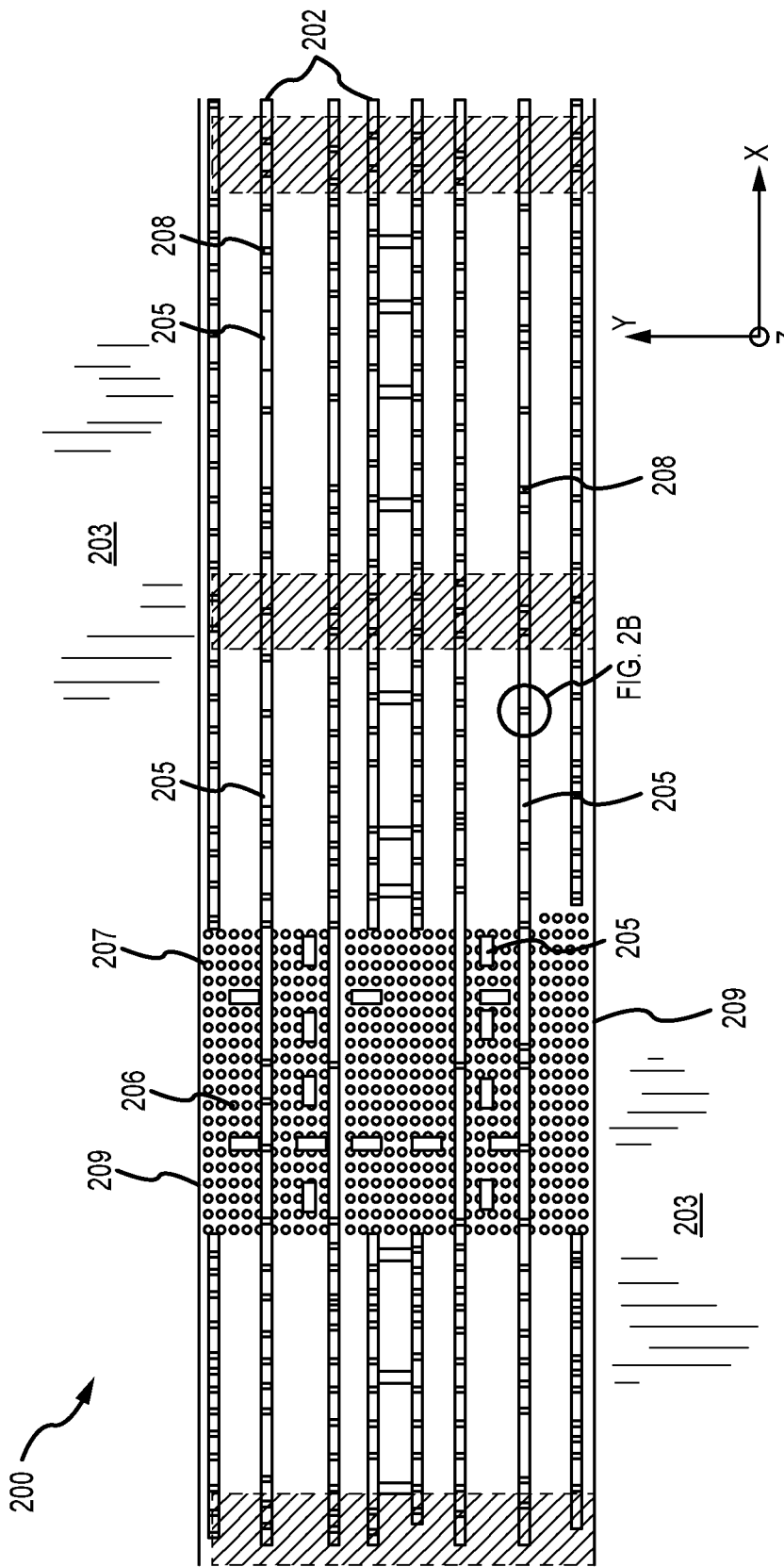
FIG. 2A illustrates an overhead view cargo deck of a cargo handling system, in accordance with various embodiments.

Referring now to FIG. 2A, a portion of a cargo handling system 200 is illustrated, in accordance with various embodiments. The cargo handling system 200 is illustrated with reference to an XYZ coordinate system, with the X-direction extending longitudinally and the Z-direction extending vertically with respect to an aircraft in which the cargo handling system 200 is positioned, such as, for example, the aircraft 10 described above with reference to FIG. 1. In various embodiments, the cargo handling system 200 includes a plurality of trays 202 configured for support by a cargo deck 203, such as, for example, the cargo deck 103 described above with reference to FIG. 1B. The plurality of trays 202 may be configured to support a unit load device (ULD), such as, for example, the unit load device (ULD) 104 described above with reference to FIG. 1B. In various embodiments, each ULD may comprise a container or a pallet configured to hold cargo as described above. In various embodiments, the plurality of trays 202 is disposed throughout the cargo deck 203 and may support a plurality of power drive units 205, a plurality of ball panels 206, each having a plurality of ball transfer units 207, and a plurality of brake caster assemblies 208, together with other components configured to convey cargo over the cargo deck 203. In various embodiments, the plurality of brake caster assemblies 208 is located throughout the cargo handling system 200 or the cargo deck 203 and may also be located proximate a cargo load door 209, such as, for example, the cargo load door 16 described above with reference to FIG. 1A.

Figure 2B:
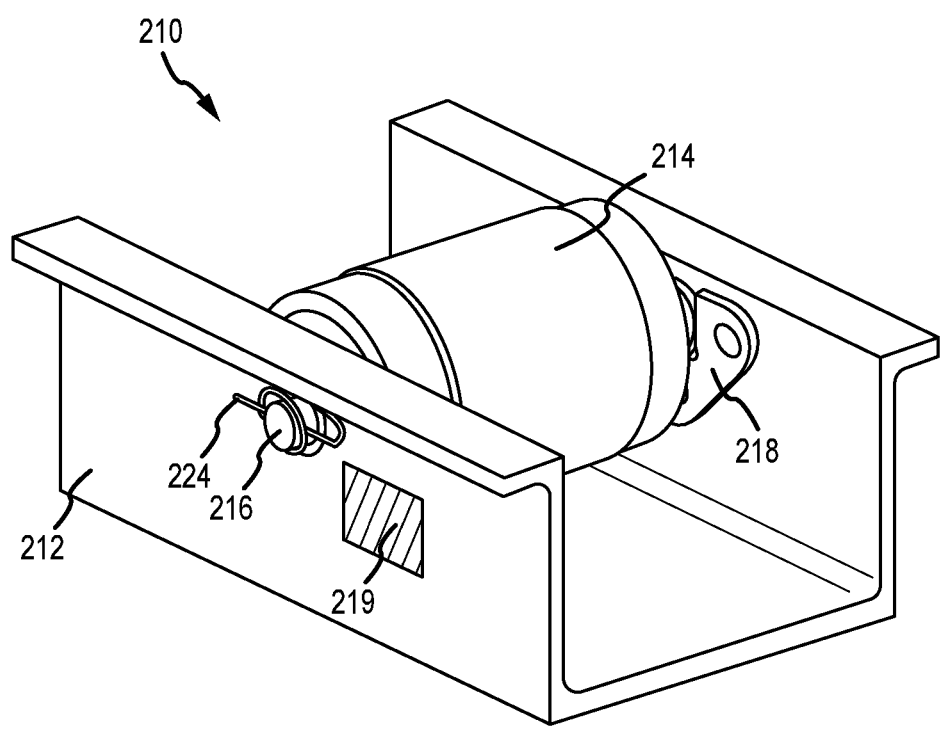
FIGS. 2B and 2C illustrate exploded and assembled views of a brake caster, in accordance with various embodiments.
Figure 2C:
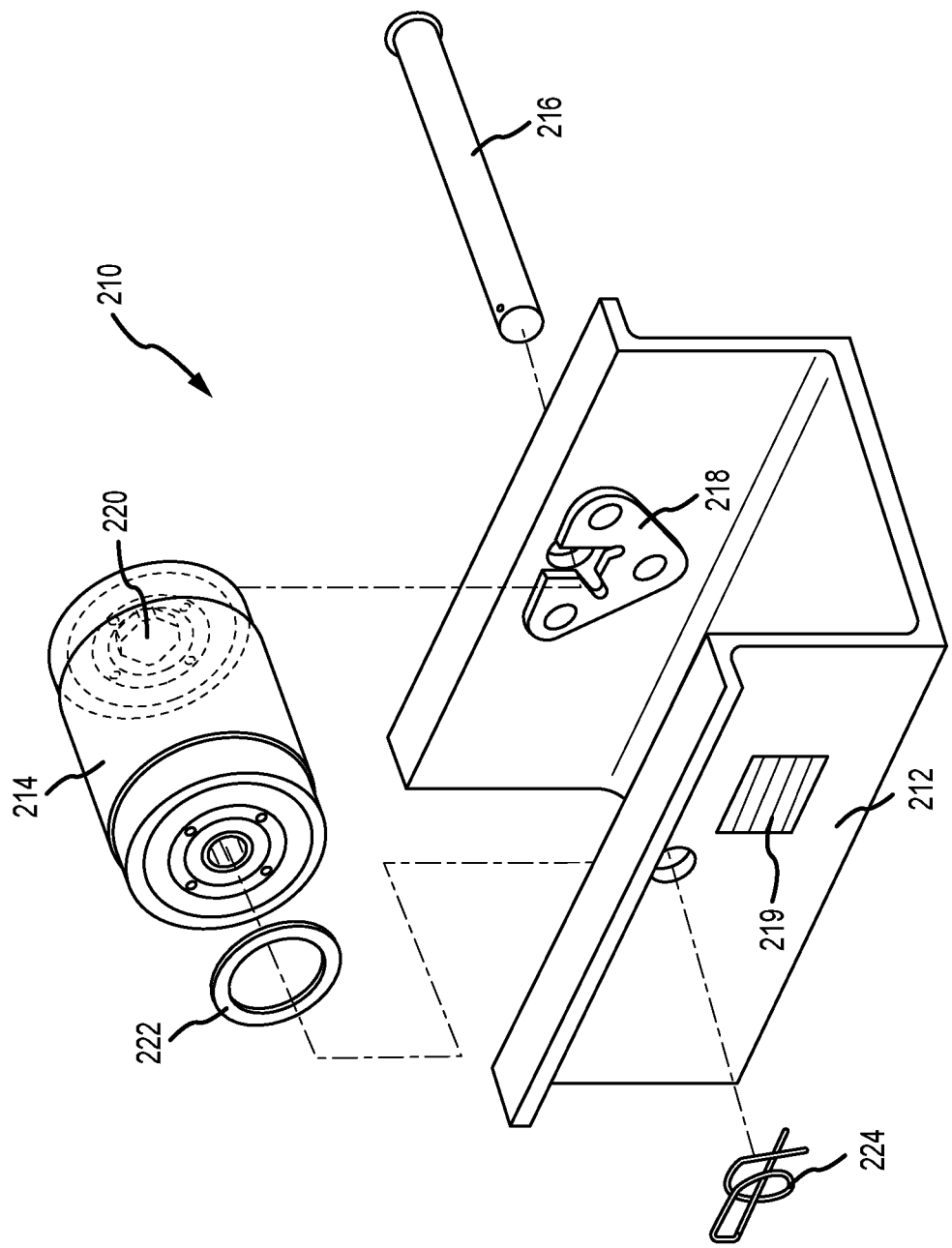

Referring now to FIGS. 2B and 2C, a brake caster assembly 210, such as, for example, one of the brake caster assemblies 208 described above with reference to FIG. 2A, is illustrated, both as being installed in a tray 212 (FIG. 2B) and as being uninstalled from the tray 212 (FIG. 2C). The tray 212 is a representative portion of one of the plurality of trays 202 described above with reference to FIG. 2A. In various embodiments, the brake caster assembly 210 includes a brake mechanism 214 configured to rotate with respect to a shaft 216. As described further below, an anti-rotation plate 218 is mounted to the tray 212 and is configured to receive a locking feature 220 (e.g., a square-shaped end) of a hollow shaft that extends axially internal to the brake mechanism 214. In various embodiments, a washer 222 is disposed on the side of the brake mechanism 214 opposite the anti-rotation plate 218. When assembled, a retainer 224 (e.g., a clip) extends through an end of the shaft 216 to maintain the brake caster assembly 210 in assembled form while installed in the tray 212.

Referring now to FIGS. 3A, 3B, 3C and 3D, various illustrations are provided to further describe the components and other aspects of a brake mechanism 314, similar to the brake mechanism 214 described above with reference to FIGS. 2A-2C. In various embodiments, for example, the brake mechanism 314 includes a roller cylinder 326 having a rubber surface 327 configured to provide a frictional surface to engage a bottom surface of a ULD, a brake subassembly 328, a brake shaft 330, a hollow shaft 332 disposed within the brake shaft 330, a first unidirectional roller bearing 334 and a second unidirectional roller bearing 336, with the unidirectional roller bearings disposed between the brake shaft 330 and the hollow shaft 332 and configured to permit the brake shaft 330 to rotate with respect to the hollow shaft 332. A first roller bearing 338 and a first spacer 340 are disposed between the hollow shaft 332 and the roller cylinder 326 at a first end 342 of the brake mechanism 314 and a second roller bearing 339 and a second spacer 341 are disposed between the hollow shaft 332 and the roller cylinder 326 at a second end 343 of the brake mechanism 314. The roller bearings are configured to permit the roller cylinder 326 to rotate with respect to the hollow shaft 332. As described above, the hollow shaft 332 includes a locking feature 320 (e.g., a square-shaped end) having flat surfaces configured to limit or prevent the hollow shaft 332 from rotating with respect to a tray—e.g., the tray 212 described above with reference to FIGS. 2B and 2C—when installed within the tray.

Figure 3A:
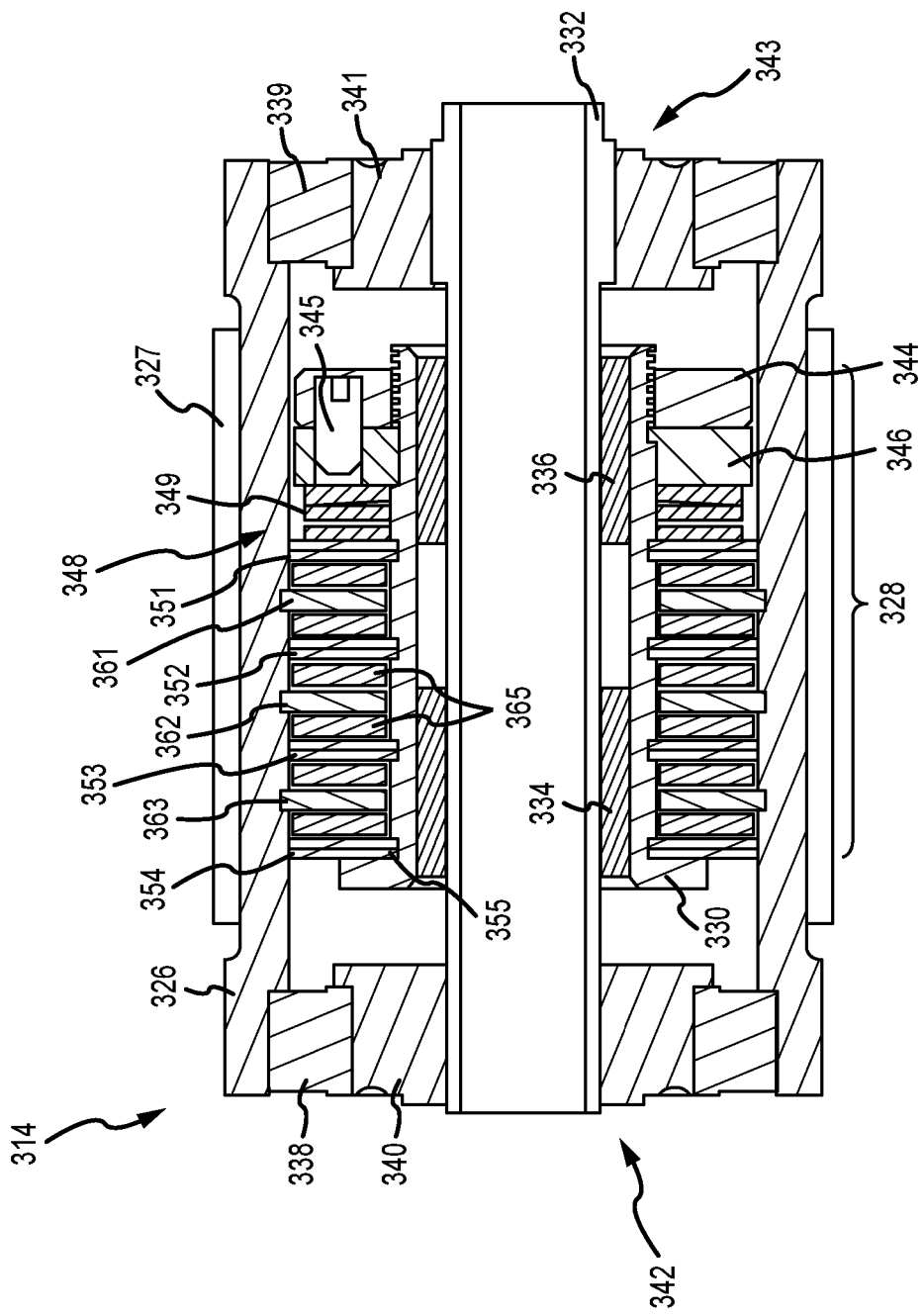
FIG. 3A illustrates a cross sectional schematic view of a brake mechanism, in accordance with various embodiments.
Figure 3D:
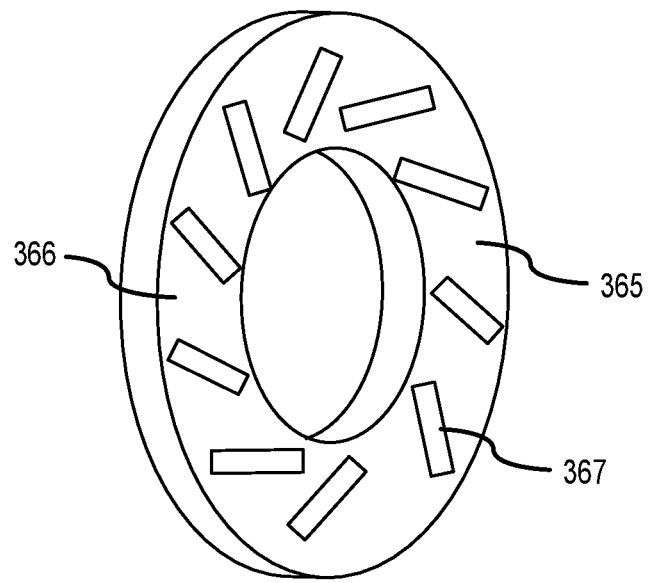
FIG. 3D illustrates a perspective view of a roller cage element having a plurality of rollers used in an assembled brake mechanism, in accordance with various embodiments.

Referring primarily to FIGS. 3A and 3B, the brake subassembly 328 includes a nut 344, a nut retainer 346 and a bias element 348, such as, for example, a Belleville spring 349. As illustrated in FIG. 3A, the nut 344 may be threaded onto the brake shaft 330 and locked to the nut retainer 346 via a lock screw 345. The brake subassembly 328 further includes one or more piezoelectric disks, such as, for example, a first piezoelectric disk 351, a second piezoelectric disk 352, a third piezoelectric disk 353 and a fourth piezo electric disk 354. In various embodiments, the one or more piezoelectric disks includes a radially inward extending tab 355 (or a plurality of such tabs) configured for being received by an elongate slot 356 extending axially along an outer cylindrical surface of the brake shaft 330. In various embodiments, the one or more piezoelectric disks act as stators, in that they generally do not rotate with respect to the hollow shaft 332. Similarly, the brake subassembly 328 includes one or more rotor disks, including, for example, a first rotor disk 361, a second rotor disk 362 and a third rotor disk 363. In various embodiments, the one or more rotor disks include a radially outward extending tab 364 configured for being received by an elongate slot extending axially along an inner cylindrical surface of the roller cylinder 326. In various embodiments, the one or more rotor disks act as rotors, in that they generally rotate, together with the roller cylinder 326, with respect to the hollow shaft 332.

The piezoelectric disks and the rotor disks act similar to stator disks and rotor disks, respectively, in a friction-based brake stack. In various embodiments, however, a roller cage element 365, including a roller cage 366 and a plurality or rollers 367 (see FIGS. 3A and 3D), is disposed between opposing sets of faces of a piezoelectric disk and a rotor disk to reduce or avoid surface contact between the opposing faces and the wear and heat that would be otherwise generated. As illustrated, an axis of each roller of the plurality of rollers 367 mounted within each roller cage 366 is inclined at an angle with respect to a radial direction (e.g., a direction perpendicular to an axis of the brake shaft 330). Inclination of the rollers at an angle provides a more effective braking action when an axial load is applied to the brake subassembly.

Figure 3E:
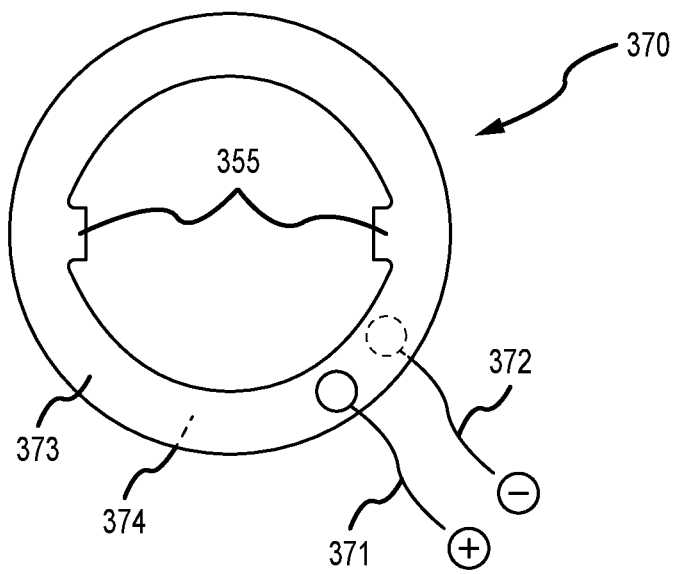
FIG. 3E illustrates an axial view of a piezoelectric disk, in accordance with various embodiments.

Referring now to FIG. 3E, with continued reference to FIG. 3B, a piezoelectric disk 370, representative of the one or more piezoelectric disks described above, is illustrated. The piezoelectric disk 370 includes a radially inward extending tab 355 configured for being received by the elongate slot 356 extending axially along the brake shaft 330. A first conductor 371 is disposed on a first side 373 of the piezoelectric disk 370 and a second conductor 372 is disposed on a second side 374 of the piezoelectric disk 370 opposite the first side 373. As illustrated in FIG. 3B, the first conductor 371 and the second conductor 372 may be routed through the hollow shaft 332 and to one or more of the piezoelectric disks. When an electric current is passed through the piezoelectric disk 370 via the first conductor 371 and the second conductor 372 (or when a voltage difference is applied across the conductors), the piezoelectric disk 370 will expand in an axial distance in an axial direction (with respect to the brake shaft) in proportion to the current (or the voltage difference). Expansion of the piezoelectric disk 370 (or the plurality of piezoelectric disks described above) will increase the compressive load between the various disks comprising the brake mechanism 314, thereby increasing a rotational resistance to the roller cylinder with respect to the brake shaft and the brake force applied to a ULD by the brake mechanism 314. In various embodiments, the current or voltage applies to the piezoelectric disk 370 may be made a function of the weight of the ULD being conveyed over the brake mechanism 314 during a loading or unloading process. Accordingly, for relatively heavy ULDs, a greater current or voltage may be applied, leading to a greater braking force, and for relatively light ULDs, a lesser current or voltage may be applied, leading to a lesser braking force. A load cell (e.g., the load cell 219 illustrated in FIGS. 2B and 2C) may be employed to measure the weight of a ULD as it approaches or passes over the brake mechanism 314. A signal from the load cell may be sent to a processor that, in turn, controls the current or voltage applied to the piezoelectric disk 370 as a function of the weight of the ULD.

While the preceding discussion focuses on the piezoelectric disk 370, it will be appreciated that the braking mechanism includes any number of piezoelectric disks (e.g., the first piezoelectric disk 351, the second piezoelectric disk 352, the third piezoelectric disk 353 and the fourth piezo electric disk 354). Further it will be appreciated that any such piezoelectric disk may comprise a plurality of piezoelectric disks positioned adjacent one another (or stacked next to one another). In various embodiments, for example, the amount of expansion of each piezoelectric disk is equal to the voltage applied across the conductors multiplied by the piezoelectric coefficient (d33) of the piezoelectric material. The resulting expansion does not typically depend on the dimension (e.g., thickness) of each piezoelectric disk. Therefore, stacking piezoelectric disks may yield a multiplying effect on the amount of expansion that is achieved. A stack of two piezoelectric disks (as is illustrated for each of the first piezoelectric disk 351, the second piezoelectric disk 352, the third piezoelectric disk 353 and the fourth piezo electric disk 354) will produce twice the expansion at the same applied voltage as will a single piezoelectric disk at the same applied voltage.

Figure 4:
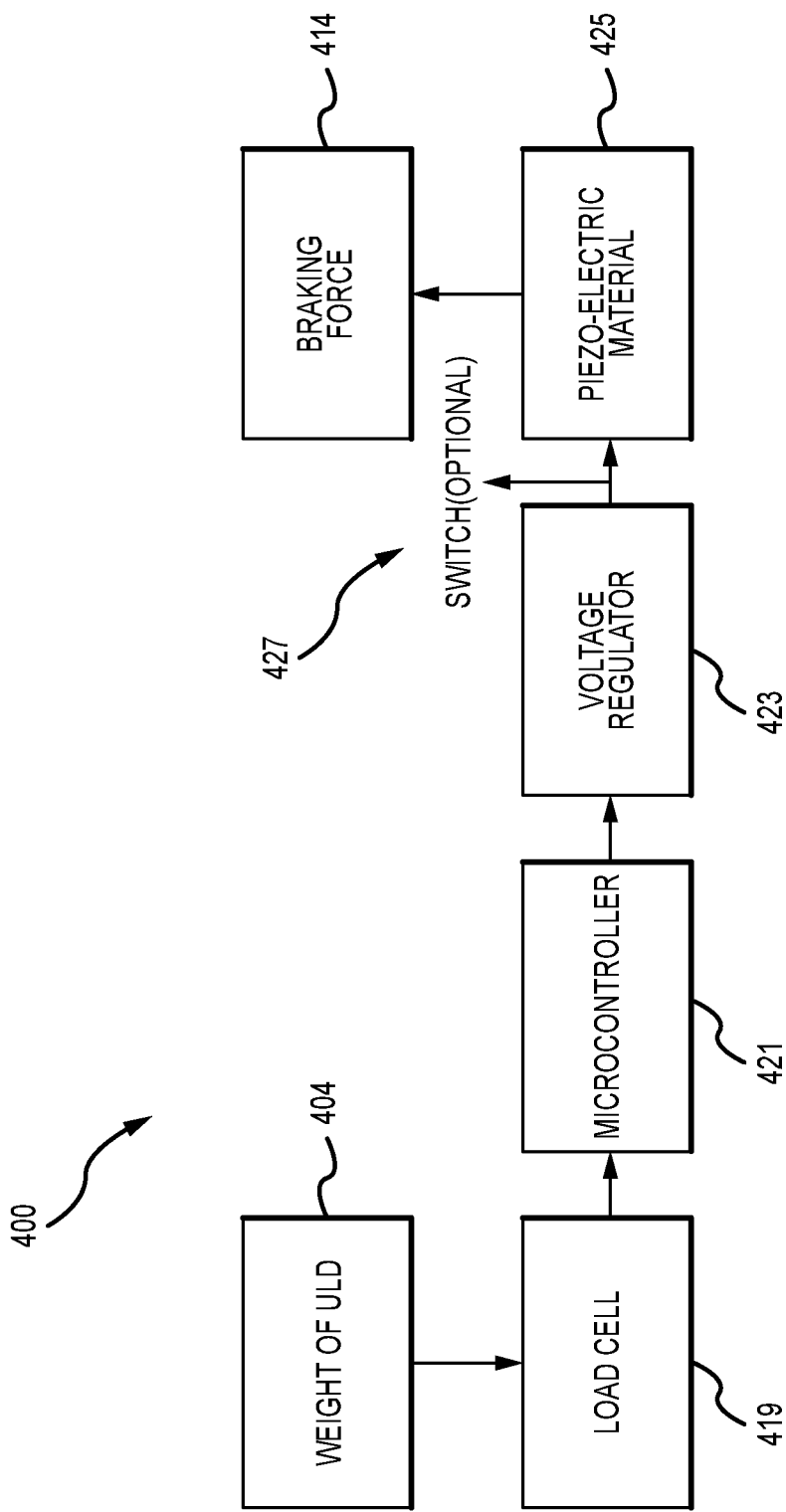
FIG. 4 is a flowchart describing a system configured to adjust a braking force applied by a brake caster, in accordance with various embodiments.

Referring now to FIG. 4, a flowchart describing a system 400 for adjusting a braking force of a brake caster is illustrated. In various embodiments, the system includes a load cell 419 configured to measure the weight of a ULD 404 being conveyed across a brake mechanism 414, such as, for example, the brake mechanism 314 described above. A signal from the load cell 419 representative of the weight of the ULD 404 is transmitted to a microcontroller 421, where the signal is processed and then transmitted to a voltage regulator 423. The voltage regulator 423 then provides a voltage (or a current) to a piezoelectric material 425 (e.g., one or more of the first piezoelectric disk 351, the second piezoelectric disk 352, the third piezoelectric disk 353 and the fourth piezo electric disk 354) that is proportional to the weight of the ULD 404. In response, the piezoelectric material 425 expands as a function of the weight of the ULD 404 and thereby adjusts the braking force applied by the brake mechanism 414. In various embodiments, a switch 427 may be used to override the voltage applied to the piezoelectric material 425 by the voltage regulator 423.

Figure 5:
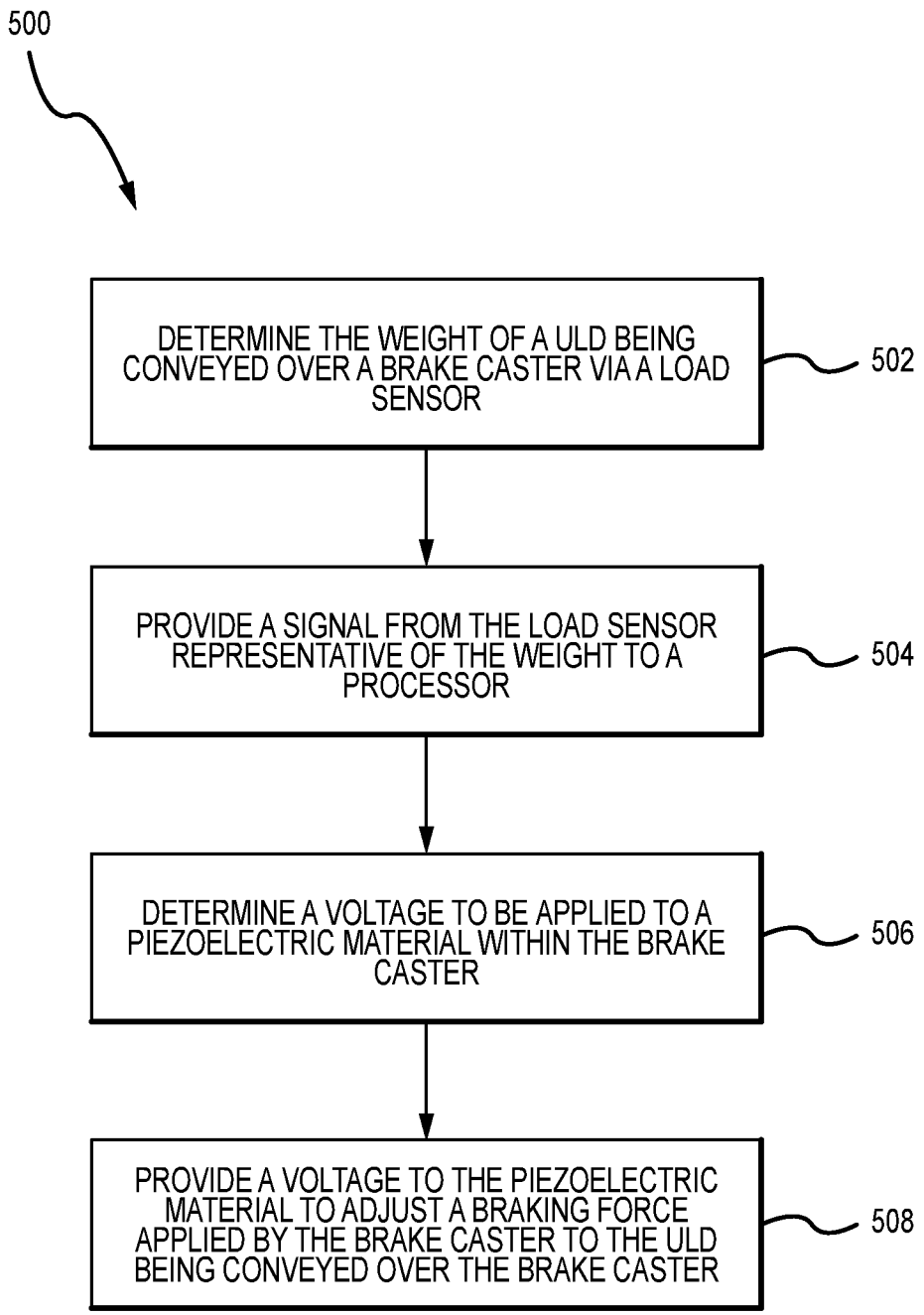
FIG. 5 describes various steps of a method for adjusting a braking force applied by a brake caster, in accordance with various embodiments.

Referring now to FIG. 5, a method 500 of adjusting a braking force of a brake caster is described. A first step 502 includes determining the weight of a ULD via a load sensor. A second step 504 includes providing a signal representative of the weight to a processor. A third step 506 includes determining by the processor a voltage to be applied to a piezoelectric material within the brake caster. A fourth step 508 includes providing a voltage to the piezoelectric material to adjust the braking force applied by the brake caster to a ULD being conveyed across the brake caster.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

In various embodiments, system program instructions or controller instructions may be loaded onto a tangible, non-transitory, computer-readable medium (also referred to herein as a tangible, non-transitory, memory) having instructions stored thereon that, in response to execution by a controller, cause the controller to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media that were found by In Re Nuijten to fall outside the scope of patentable subject matter under 35 U.S.C. § 101.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above described concepts can be used alone or in combination with any or all of the other above described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A brake mechanism for a brake caster, comprising:
   a roller cylinder having a hollow interior and an inner cylindrical surface;
   a brake shaft disposed within the hollow interior of the roller cylinder and having an outer cylindrical surface;
   a piezoelectric disk disposed within the hollow interior of the roller cylinder; and
   a rotor disk disposed adjacent the piezoelectric disk.

2. The brake mechanism of claim 1, wherein the rotor disk is configured for rotational engagement with the roller cylinder.

3. The brake mechanism of claim 2, wherein the piezoelectric disk is rotationally stationary with respect to the brake shaft.

4. The brake mechanism of claim 3, wherein the piezoelectric disk includes a radially inwardly extending tab for engagement with an elongate slot disposed within the brake shaft.

5. The brake mechanism of claim 4, wherein the rotor disk includes a radially outwardly extending tab for engagement with the roller cylinder.

6. The brake mechanism of claim 1, further comprising a hollow shaft disposed within the brake shaft.

7. The brake mechanism of claim 6, further comprising a first roller bearing disposed between the brake shaft and the hollow shaft and configured to enable the brake shaft to rotate with respect to the hollow shaft.

8. The brake mechanism of claim 7, wherein the first roller bearing is a unidirectional roller bearing.

9. The brake mechanism of claim 8, further comprising a second roller bearing disposed between the roller cylinder and the brake shaft and configured to enable the roller cylinder to rotate with respect to the brake shaft.

10. The brake mechanism of claim 9, wherein the hollow shaft includes a locking feature configured to prevent the hollow shaft from rotating with respect to a tray.

11. The brake mechanism of claim 1, wherein the piezoelectric disk is configured to expand an axial distance with respect to the brake shaft upon a voltage difference being applied across a first conductor and a second conductor, the first conductor and the second conductor being electrically coupled to the piezoelectric disk.

12. The brake mechanism of claim 11, wherein the axial distance is proportional to the voltage difference applied across the first conductor and the second conductor.

13. The brake mechanism of claim 12, wherein the piezoelectric disk is configured to provide a rotational resistance to the roller cylinder with respect to the brake shaft upon the voltage difference being applied across the first conductor and the second conductor.

14. The brake mechanism of claim 13, wherein the rotational resistance is proportional to the voltage difference applied across the first conductor and the second conductor.

15. A method for adjusting a braking force of a brake caster configured for operation within a cargo handling system, comprising:
    determining a weight of a load being conveyed over the brake caster via a load sensor;
    providing a signal to a processor, the signal being representative of the weight of the load being conveyed over the brake caster;
    determining a voltage to be applied to a piezoelectric material disposed within the brake caster and configured to provide a rotational resistance to the brake caster; and
    applying the voltage to the piezoelectric material to adjust the braking force of the brake caster.

16. The method of claim 15, wherein the brake caster includes a roller cylinder having a hollow interior and a brake shaft disposed within the hollow interior, and wherein the piezoelectric material is a piezoelectric disk disposed between the roller cylinder and the brake shaft.

17. The method of claim 16, wherein the piezoelectric disk is configured to expand an axial distance with respect to the brake shaft upon a voltage difference being applied across a first conductor and a second conductor, the first conductor and the second conductor being electrically coupled to the piezoelectric disk, and wherein the axial distance is proportional to the voltage difference applied across the first conductor and the second conductor.

18. The method of claim 17, wherein the piezoelectric disk is configured to provide the rotational resistance to the roller cylinder with respect to the brake shaft upon the voltage difference being applied across the first conductor and the second conductor, and wherein the rotational resistance is proportional to the voltage difference applied across the first conductor and the second conductor.

19. A brake subassembly for a brake mechanism, comprising:
    a piezoelectric disk configured for engagement with a roller cylinder or a brake shaft; and a rotor disk configured for engagement with the roller cylinder or the brake shaft, wherein the piezoelectric disk is configured to expand an axial distance with respect to the brake shaft upon a voltage difference being applied across a first conductor and a second conductor, the first conductor and the second conductor being electrically coupled to the piezoelectric disk, and wherein the axial distance is proportional to the voltage difference applied across the first conductor and the second conductor.

20. The brake subassembly of claim 19, wherein the piezoelectric disk is configured to provide a rotational resistance to the roller cylinder with respect to the brake shaft upon the voltage difference being applied across the first conductor and the second conductor, and wherein the rotational resistance is proportional to the voltage difference applied across the first conductor and the second conductor.

\* \* \* \* \*